(12) United States Patent
Watanabe et al.

(10) Patent No.: US 10,015,905 B2
(45) Date of Patent: Jul. 3, 2018

(54) IMMERSION COOLING DEVICE AND SEAL TANK

(71) Applicant: FUJITSU LIMITED, Kawasaki-shi, Kanagawa (JP)

(72) Inventors: Masayuki Watanabe, Yokohama (JP); Hideo Kubo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/460,764

(22) Filed: Mar. 16, 2017

(65) Prior Publication Data
US 2017/0280587 A1    Sep. 28, 2017

(30) Foreign Application Priority Data

Mar. 28, 2016 (JP) .................................. 2016-064062

(51) Int. Cl.
*H05K 7/20* (2006.01)
*H01L 23/473* (2006.01)

(52) U.S. Cl.
CPC ....... *H05K 7/20236* (2013.01); *H01L 23/473* (2013.01); *H05K 7/20272* (2013.01)

(58) Field of Classification Search
CPC ................ H01L 23/473; H01L 23/427; H01L 21/67051; G06F 1/20; G06F 2200/201; G06F 1/206; H05K 7/20236; H05K 7/20772; H05K 7/203; H05K 7/20327; H05K 7/20809; H05K 7/20218; H05K 5/067; H05K 7/20381; H05K 7/20318; H05K 7/20781; H05K 7/2079; H05K 7/20254; H05K 7/20; H05K 7/20836; H05K 7/20763; H05K 7/20272
See application file for complete search history.

(56) References Cited

U.S. PATENT DOCUMENTS

| 4,983,223 A  | * | 1/1991  | Gessner  | ................... B01D 3/00    |
|              |   |         |          | 134/105                          |
| 5,823,248 A  | * | 10/1998 | Kadota   | .................. F25B 23/006   |
|              |   |         |          | 165/104.33                       |
| 9,750,159 B2 | * | 8/2017  | Campbell | .......... H05K 7/20318          |
| 2010/0328891 A1 | * | 12/2010 | Campbell | ........... F28D 15/0266     |
|              |   |         |          | 361/700                          |

(Continued)

FOREIGN PATENT DOCUMENTS

| JP | 60-117760 A   | 6/1985 |
| JP | 2007-103820 A | 4/2007 |
| JP | 2012-084260 A | 4/2012 |

*Primary Examiner* — Adam B Dravininkas
(74) *Attorney, Agent, or Firm* — Squire Patton Boggs (US) LLP

(57) ABSTRACT

An immersion cooling device includes a refrigerant tank configured to accommodate a refrigerant liquid in which an electronic device is immersed; a seal tank configured to accommodate a sealing material and communicate with the refrigerant tank through an upper space of the seal tank, a cable connected to the electronic device being disposed in the upper portion space; and a partition member that, in a state in which a portion of the cable disposed in the upper portion space is immersed in the sealing material in a liquid state, partitions the upper portion space into a first space that is in communication with the refrigerant tank, and a second space that is in communication with an outside of the seal tank.

20 Claims, 14 Drawing Sheets

(56) References Cited

U.S. PATENT DOCUMENTS

| | | | | |
|---|---|---|---|---|
| 2013/0021752 A1* | 1/2013 | Campbell | ............... | H05K 13/00 |
| | | | | 361/700 |
| 2013/0277008 A1* | 10/2013 | Ishikura | ................... | F28F 11/00 |
| | | | | 165/11.1 |
| 2014/0216686 A1* | 8/2014 | Shelnutt | ............. | H05K 7/20809 |
| | | | | 165/67 |
| 2015/0373882 A1* | 12/2015 | Smith | ................ | H05K 7/20818 |
| | | | | 361/679.46 |
| 2016/0143191 A1* | 5/2016 | Smith | ............... | H05K 7/20836 |
| | | | | 361/679.46 |
| 2016/0345461 A1* | 11/2016 | Smith | .................. | H05K 5/0017 |
| 2017/0223870 A1* | 8/2017 | Smith | ....................... | F25D 3/00 |

* cited by examiner

IMMERSION COOLING DEVICE AND SEAL TANK

CROSS-REFERENCE TO RELATED APPLICATION

This application is based upon and claims the benefit of priority of the prior Japanese Patent Application No. 2016-064062, filed on Mar. 28, 2016, the entire contents of which are incorporated herein by reference.

FIELD

The exemplary embodiments discussed herein are related to an immersion cooling device.

BACKGROUND

There are cooling devices that cool electronic devices (see Japanese Laid-open Patent Publication No. 60-117760, Japanese Laid-open Patent Publication No. 2007-103820, for example). Furthermore, there is a water cutoff structure for a wire passing through a through hole of a panel (see Japanese Laid-open Patent Publication No. 2012-084260, for example).

Incidentally, there is an immersion cooling device, serving as a cooling device for an electronic device, that immerses an electronic device in a refrigerant liquid retained in a refrigerant tank. In such an immersion cooling device, a cable that is connected to the electronic device is drawn out to the outside of the refrigerant tank though a cable outlet formed in the refrigerant tank.

SUMMARY

According to an aspect of the invention, an immersion cooling device includes a refrigerant tank configured to accommodate a refrigerant liquid; a seal tank configured to accommodate a sealing material and communicate with the refrigerant tank through an upper space of the seal tank; and a partition member configured to separate the seal tank with the sealing material into two portion one of which communicates with the refrigerant tank and the other of which communicates with the outside of the seal tank.

According to another aspect of the invention, an immersion cooling device includes a refrigerant tank configured to accommodate a refrigerant liquid in which an electronic device is immersed; a seal tank configured to accommodate a sealing material and communicate with the refrigerant tank through an upper space of the seal tank, a cable connected to the electronic device being disposed in the upper portion space; and a partition member that, in a state in which a portion of the cable disposed in the upper portion space is immersed in the sealing material in a liquid state, partitions the upper portion space into a first space that is in communication with the refrigerant tank, and a second space that is in communication with an outside of the seal tank.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

In one aspect, the technique disclosed in the present application is capable of suppressing leakage of a vaporized refrigerant that is a refrigerant liquid that has been vaporized.

DESCRIPTION OF EMBODIMENTS

Note that there are refrigerant liquids, which is used for the cooling device for an electronic device described in the background, that easily vaporize at room temperature. In particular, when the refrigerant liquid is heated by the electronic device, vaporization of the refrigerant liquid is facilitated. Accordingly, the vaporized refrigerant that is a vaporized refrigerant liquid may leak to the outside of the refrigerant tank through a gap between the cable outlet and the cable. As a measure taken for the above, one may conceive of filling a sealing material into the gap between the cable outlet and the cable.

However, for example, in a case in which a plurality of cables are arranged in the cable outlet, the vaporized refrigerant may leak through a gap between adjacent cables into which the sealing material has not been filled.

Accordingly, it is desired to suppress leaking of a vaporized refrigerant caused by vaporization of refrigerant liquid.

First Exemplary Embodiment

Figure 1:
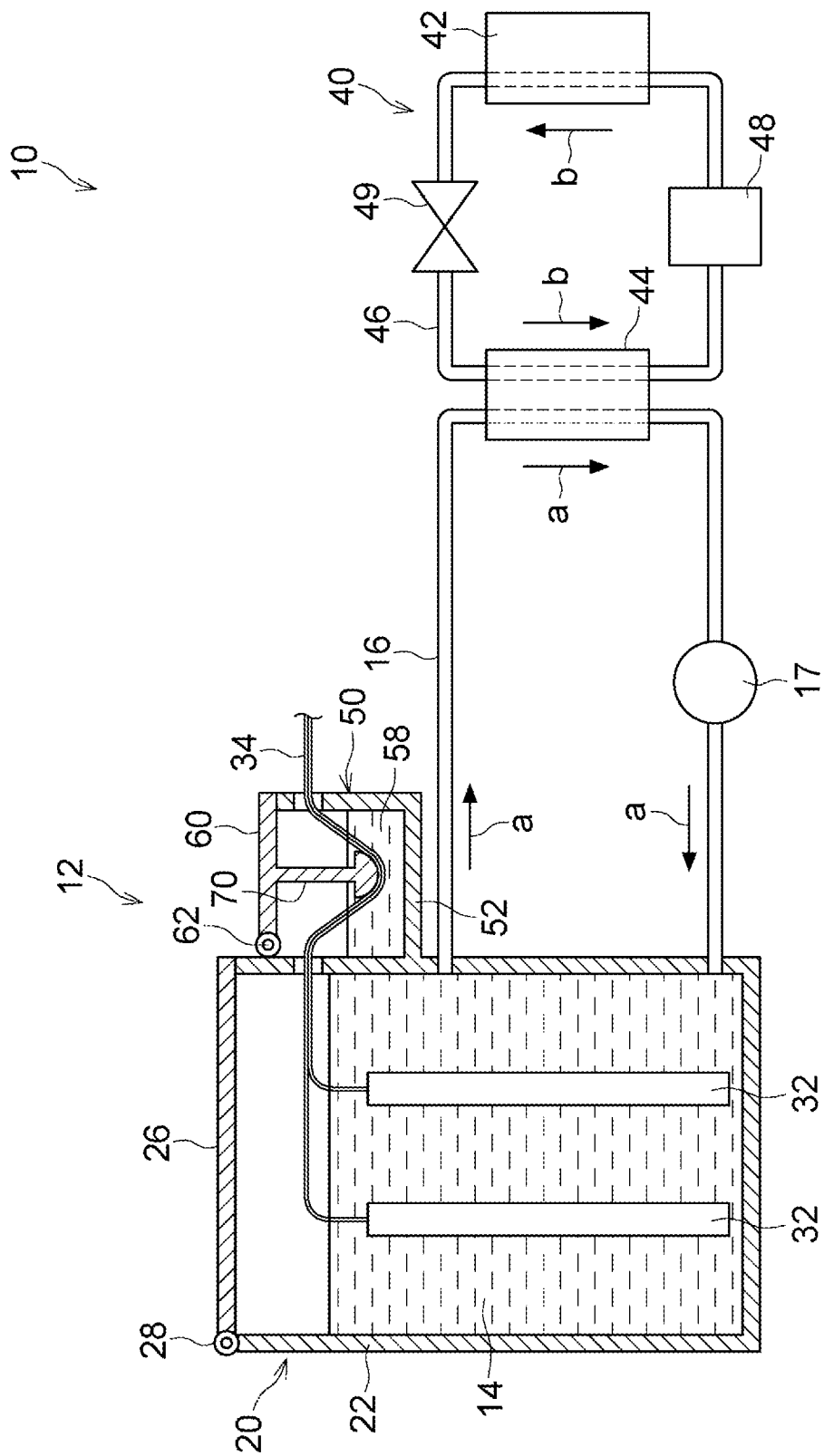
FIG. 1 is a system configuration diagram illustrating an immersion cooling system according to a first exemplary embodiment.

Hereinafter, a first exemplary embodiment of the technique disclosed in the present application will be described.
Immersion Cooling System As illustrated in FIG. 1, an immersion cooling system 10 according to the first exemplary embodiment includes an immersion cooling device 12 and a refrigerant cooling device 40. The immersion cooling device 12 and the refrigerant cooling device 40 are connected to each other through a circulation passage 16.

[Immersion Cooling Device]

Figure 2:
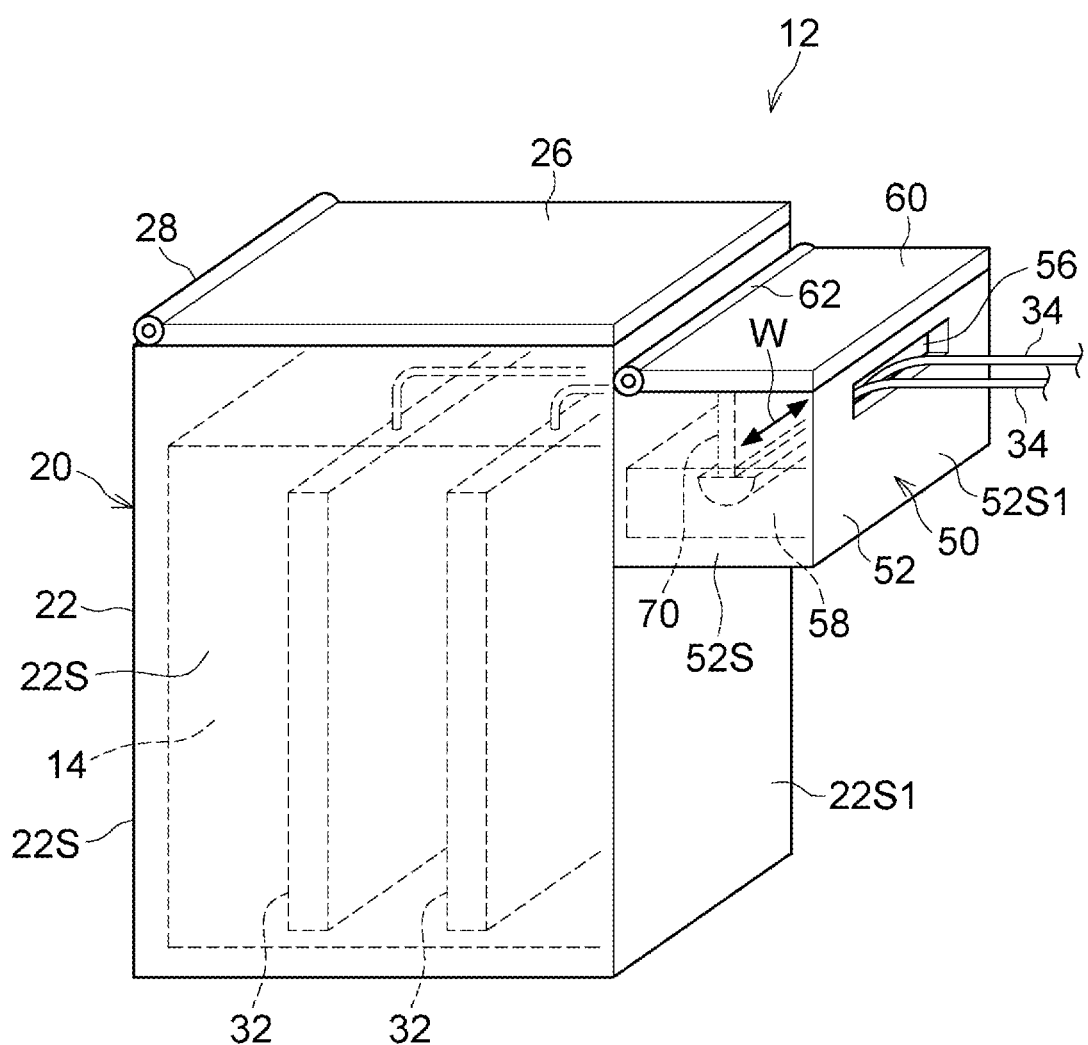
FIG. 2 is a perspective view illustrating the immersion cooling device illustrated in FIG. 1.

As illustrated in FIG. 2, the immersion cooling device 12 includes a refrigerant tank 20 and a seal tank 50. The refrigerant tank 20 is a hermetic vessel (airtight vessel) in which a refrigerant liquid 14 is accommodated. The refrigerant tank 20 includes a refrigerant tank body 22 and a refrigerant tank lid 26. The refrigerant tank body 22 is a boxed-shaped container having a storage opening 30 (see FIG. 4A) in an upper portion.

Figure 3:
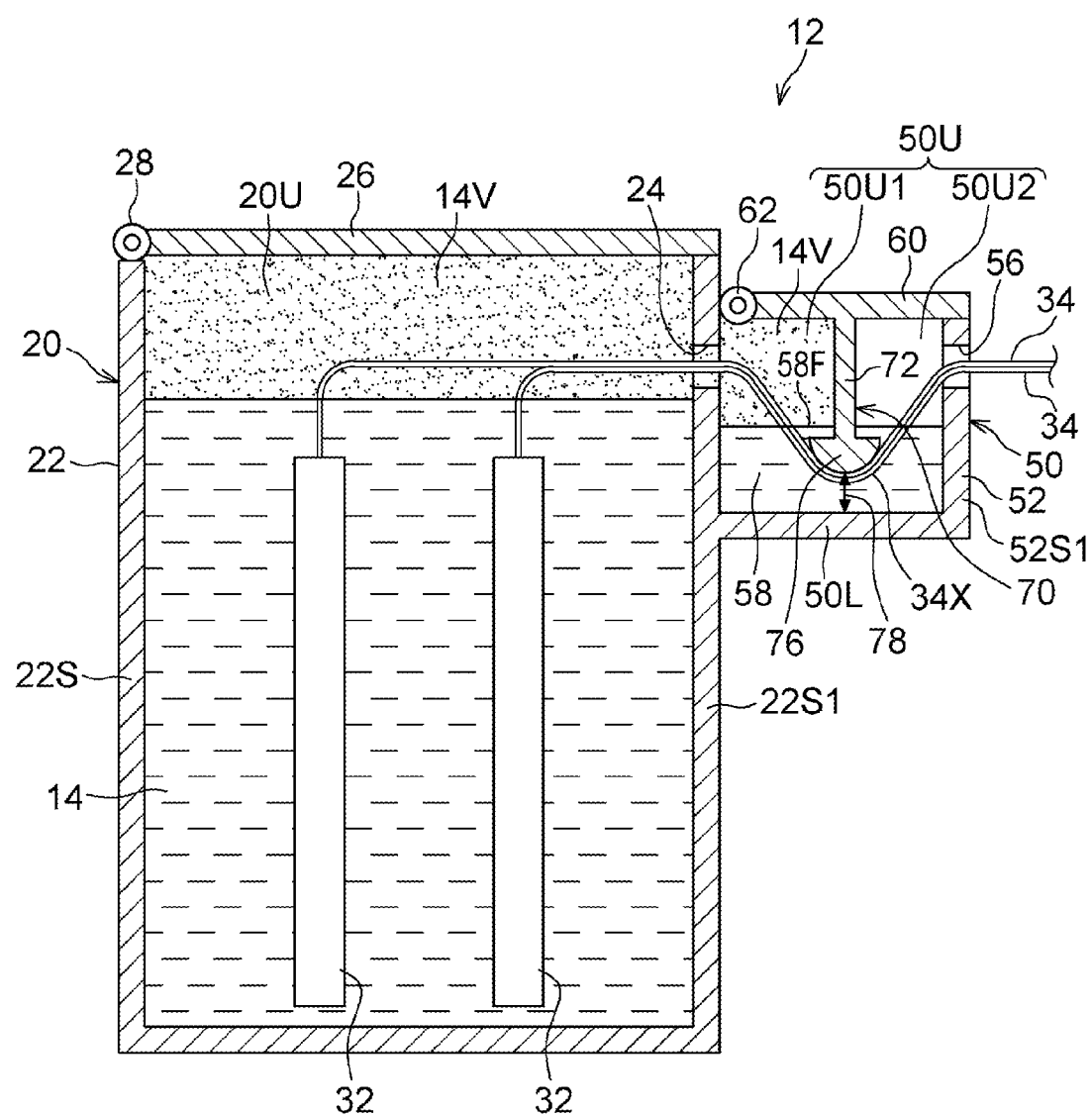
FIG. 3 is a longitudinal section illustrating the immersion cooling device illustrated FIG. 2.

The refrigerant tank body 22 includes four side walls 22S. As illustrated in FIG. 3, a connection port 24 is formed in an upper portion of a predetermined side wall 22S1 among the four side walls 22S1 of the refrigerant tank body 22. The connection port 24 is, for example, a rectangular through hole that penetrates through the side wall 22S1 in the thickness direction.

The refrigerant liquid 14 is accommodated (retained) in the refrigerant tank body 22. The refrigerant liquid 14 is filled into the refrigerant tank body 22 from the storage opening 30 so as not to leak from the connection port 24. Furthermore, in a state in which the refrigerant liquid 14 is accommodated in the refrigerant tank body 22, an upper portion of the refrigerant tank body 22 (the refrigerant tank 20) is a space (hereinafter referred to as an "upper portion space 20U") where there is no refrigerant liquid 14.

The refrigerant liquid 14 has an electrical insulation property and is thermally conductive, and is a liquid (a liquid refrigerant) that is easily vaporized at room temperature. Note that room temperature refers to, for example, an average annual temperature of the region where the immersion cooling device 12 is installed. Such a refrigerant liquid 14 is, for example, an inert fluorine-containing liquid (Fluorinert (registered trademark) or Novec (registered trademark), for example).

Figure 4A:
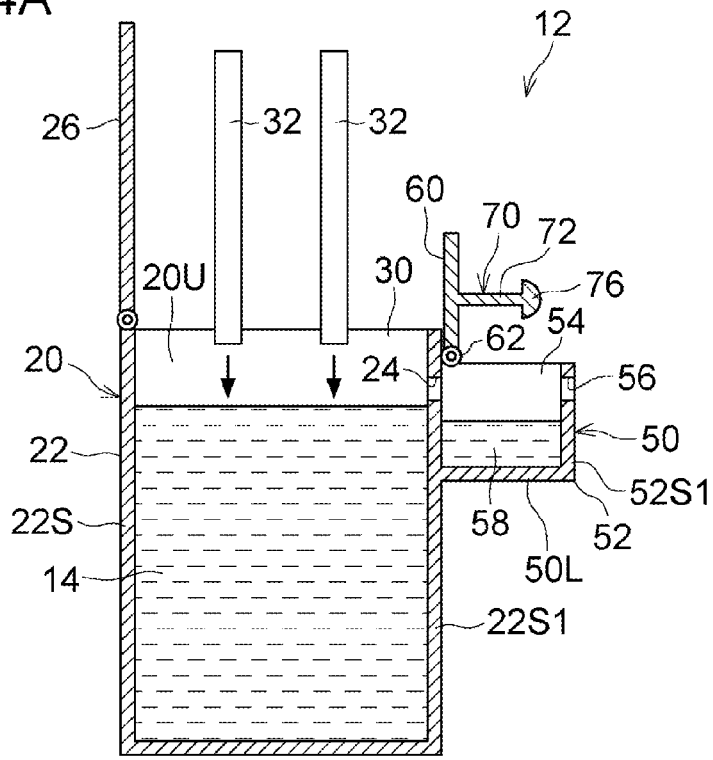
FIG. 4A is a longitudinal section illustrating a refrigerant tank lid hinge and a seal tank lid hinge illustrated in FIG. 3 in an open state.
Figure 4B:
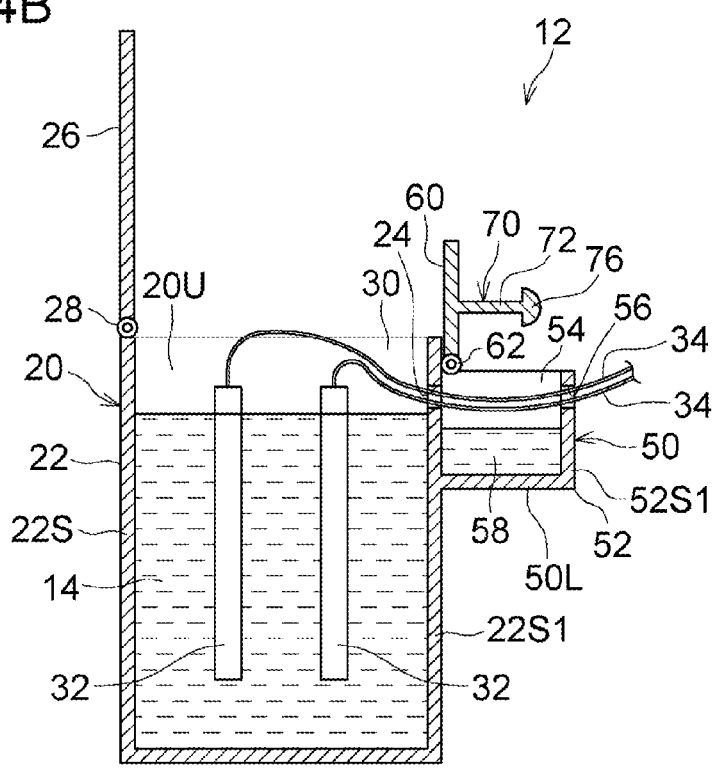
FIG. 4B is a longitudinal section illustrating a process of accommodating electronic devices in the refrigerant tank illustrated in FIG. 4A.

The refrigerant tank lid 26 is attached to an upper end portion of the refrigerant tank body 22 with a hinge 28. Furthermore, as illustrated in FIG. 4A, by pivoting the refrigerant tank lid 26 with respect to the refrigerant tank body 22 about the hinge 28, the storage opening 30 of the refrigerant tank body 22 is opened and closed. Furthermore, a sealing material (not shown) is provided in a peripheral edge portion of the storage opening 30 of the refrigerant tank body 22. With the above, in a state in which the refrigerant tank lid 26 is closed, the gap between the refrigerant tank lid 26 and the peripheral edge portion of the storage opening 30 is sealed with the sealing material.

As illustrated in FIG. 3, a plurality of electronic devices 32 that are objects to be cooled are accommodated in the refrigerant tank 20. Each electronic device 32 is arranged in the refrigerant tank body 22 through the storage opening 30. Furthermore, each electronic device 32 is accommodated in the refrigerant tank body 22 while being immersed in the refrigerant liquid 14.

Each electronic device 32 is, for example, a server including a printed board on which a plurality of electronic components are mounted, and a housing in which the printed board is accommodated. Furthermore, a cable 34 is electrically connected to the print board of each electronic device 32. Each cable 34 is arranged in an upper portion space 50U of the seal tank 50 described later from the upper portion space 20U of the refrigerant tank 20 through the connection port 24.

[Refrigerant Cooling Device]

As illustrated in FIG. 1, the refrigerant cooling device 40 is connected to the refrigerant tank 20 through the circulation passage 16. The circulation passage 16 includes a pipe in which the refrigerant liquid 14 flows. Furthermore, a pump 17 is provided in the circulation passage 16. When the pump 17 is driven, the refrigerant liquid 14 is circulated between the refrigerant tank 20 and the refrigerant cooling device 40. Note that arrows "a" illustrated in FIG. 1 indicate the directions in which the refrigerant liquid 14 circulates.

The refrigerant cooling device 40 is a refrigerator that cools the refrigerant liquid 14 using a refrigerating cycle, for example. The electronic devices 32 are cooled by heat exchange between the refrigerant liquid 14 that has been cooled by the refrigerant cooling device 40 and the electronic devices 32.

Specifically, the refrigerant cooling device 40 includes a condenser 42 and a heat exchanger 44. The condenser 42 and the heat exchanger 44 are connected to each other through a refrigerant circulation passage 46. The refrigerant circulation passage 46 includes a pipe inside of which refrigerant flows, for example. Note that arrows "b" illustrated in FIG. 1 indicate the directions in which the refrigerant circulates.

Furthermore, a compressor 48 is provided in the refrigerant circulation passage 46. The compressor 48 compresses the refrigerant in a gaseous state flowing from the heat exchanger 44 to the condenser 42. The condenser 42 includes a cooling fan (not shown) that cools the gaseous-state refrigerant that has been compressed by the compressor 48. The cooling fan condenses the refrigerant by cooling the gaseous-state refrigerant.

Furthermore, an expansion valve 49 is provided in the refrigerant circulation passage 46. The expansion valve 49 expands and decompresses the refrigerant in a liquid state flowing from the condenser 42 to the heat exchanger 44. The heat exchanger 44 vaporizes the refrigerant by exchanging heat between the liquid-state refrigerant that has been decompressed by the expansion valve 49 and the refrigerant liquid 14 flowing in the circulation passage 16. With the above, the latent heat of vaporization of the refrigerant is taken away from the refrigerant liquid 14 and the refrigerant liquid 14 is cooled.

The refrigerant that has been vaporized by the heat exchanger 44 is condensed by the condenser 42 described above after being compressed by the compressor 48. The refrigerant liquid 14 is cooled in the above manner by circulating the refrigerant through the compressor 48, the condenser 42, the expansion valve 49, and the heat exchanger 44.

Note that the refrigerant cooling device may be, for example, a cooling tower that cools the refrigerant by releasing the heat of the refrigerant into the atmosphere.

[Seal Tank]

Figure 5A:
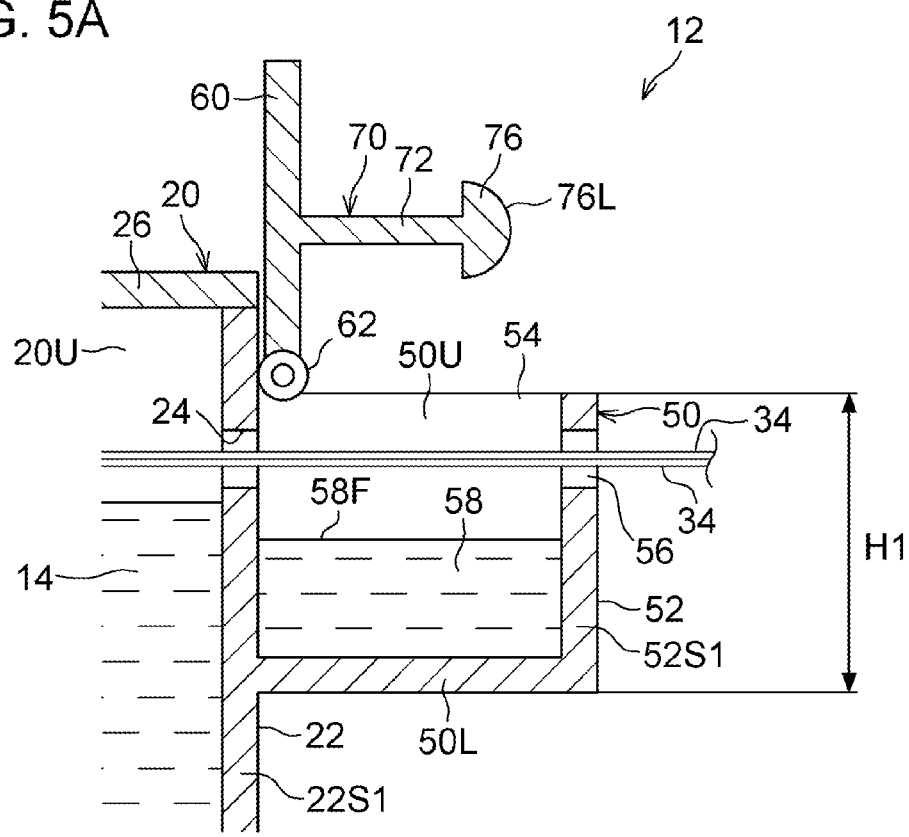
FIG. 5A is an enlarged cross-sectional view illustrating the seal tank illustrated in FIG. 4B.
Figure 5B:
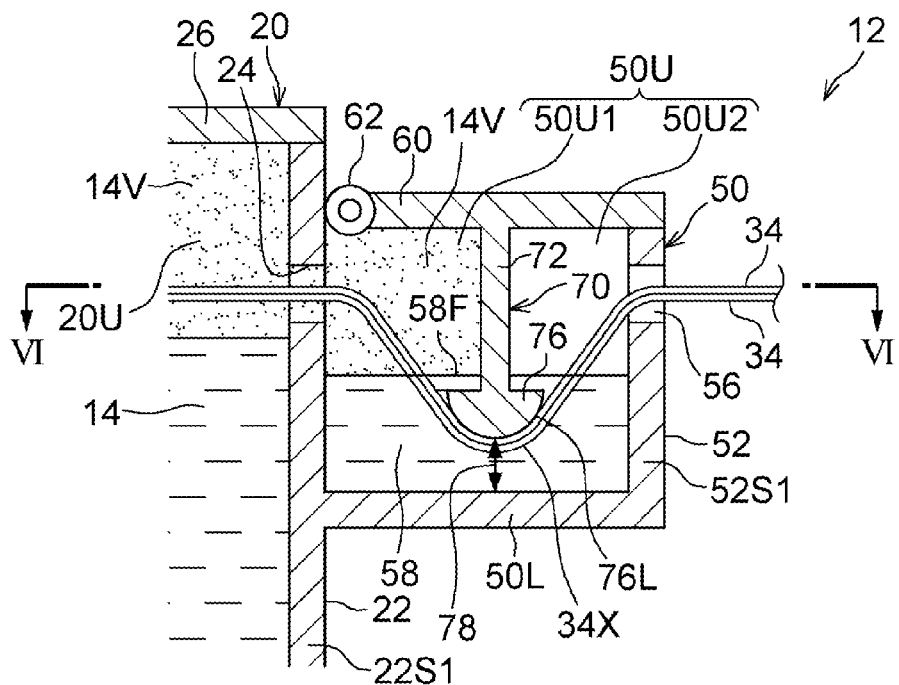
FIG. 5B is a cross-sectional view illustrating the seal tank lid hinge illustrated in FIG. 5A in a closed state.

As illustrated in FIGS. 5A and 5B, the seal tank 50 is provided adjacent to the refrigerant tank 20. The seal tank 50 is a container in which a sealing liquid 58 is accommodated. The seal tank 50 includes a seal tank body 52 and a seal tank lid 60. The seal tank body 52 is a boxed-shaped container having a seal tank opening 54 in an upper portion. The seal tank body 52 includes a plurality of side walls 52S (see FIG. 2). Note that the seal tank body 52 shares the side wall 22S1 with the refrigerant tank body 22 described above.

Furthermore, the seal tank body 52 includes a side wall 52S1 that opposes the side wall 22S1. A cable outlet 56 for drawing out the cables 34 to the outside of the seal tank 50 is formed in the upper portion of the side wall 52S1. The cable outlet 56 is, for example, a rectangular opening that penetrates through the side wall 52S1 in the thickness direction.

The sealing liquid 58 is accommodated (retained) inside the seal tank body 52. A liquid (a liquid sealing material), such as water or oil that does not easily vaporize at room temperature and in which the refrigerant liquid 14 does not easily dissolve, is used as the sealing liquid 58. The sealing liquid 58 is filled into the seal tank body 52 from the seal tank opening 54 so as not to leak from the connection port 24 and the cable outlet 56. Note that an additive that suppresses development of alga and moss may be added to the sealing liquid 58. Furthermore, the sealing liquid 58 is an example of the sealing material.

Furthermore, in a state in which the sealing liquid 58 is accommodated in the seal tank body 52, an upper portion of the seal tank body 52 is a space (hereinafter, referred to as the "upper portion space 50U") where there is no sealing liquid 58. The upper portion space 50U of the seal tank 50 is connected to or communicated with the upper portion space 20U of the refrigerant tank 20 described above through the connection port 24.

The seal tank lid 60 is attached to an upper end portion of the seal tank body 52 with a hinge 62. The seal tank opening 54 of the seal tank body 52 is opened and closed by pivoting the seal tank body 52 about the hinge 62. Furthermore, a sealing material (not shown) is provided in a peripheral edge portion of the seal tank opening 54. Accordingly, in a state in which the seal tank lid 60 is closed, the sealing material seals the gap between the seal tank lid 60 and the peripheral edge portion of the seal tank opening 54.

As illustrated in FIG. 5A, a partition member 70 is provided in the seal tank lid 60. The partition member 70 includes a partition 72 and a pushing portion 76. The partition 72 is formed in a plate-shape. In a state in which the seal tank lid 60 is closed, the partition 72 extends downwards from an underside of the seal tank lid 60 and opposes the side wall 22S1 of the refrigerant tank body 22.

Figure 6:
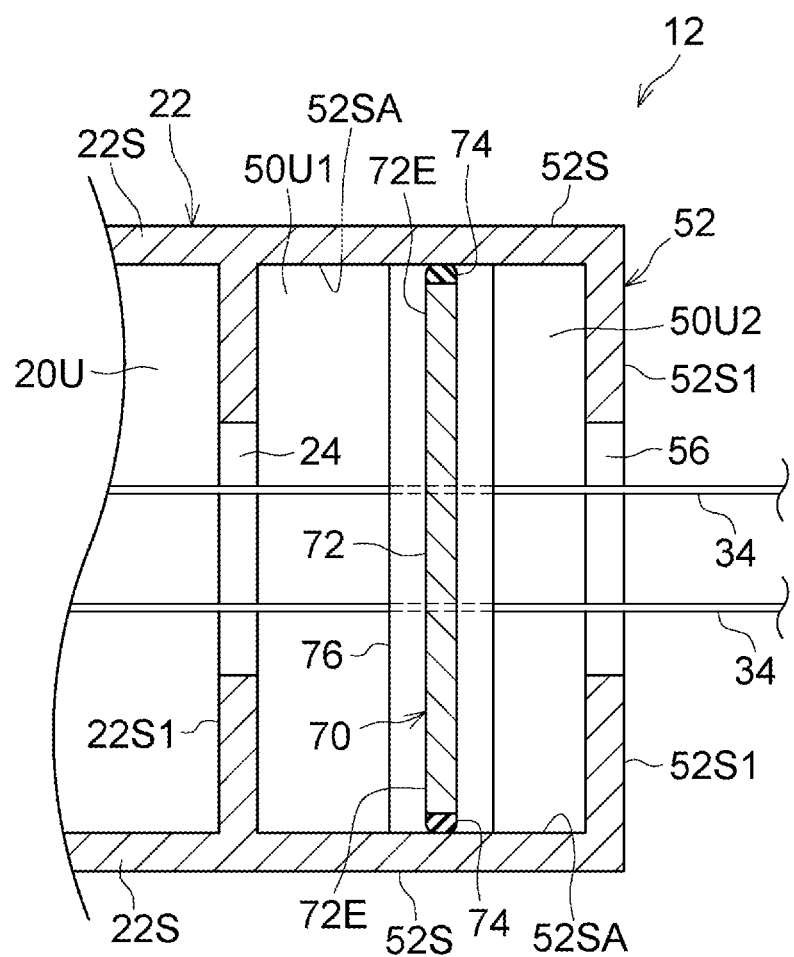
FIG. 6 is a cross-sectional view taken along line VI-VI in FIG. 5B.

As illustrated in FIG. 6 that is a view from immediately above the immersion cooling device 12, sealing materials 74 are provided in end portions 72E at both sides in a width direction of the partition 72. The sealing materials 74 are provided along the end portions 72E of the partition 72. In a state in which the seal tank lid 60 is closed, the sealing materials 74 are urged and are in contact with inner wall surfaces 52SA of the side walls 52S of the seal tank body 52. With the above, in a state in which the seal tank lid 60 is closed, the gap between the end portions 72E of the partition 72 and the inner wall surfaces 52SA of the seal tank body 52 is sealed.

Furthermore, as illustrated in FIG. 5B, in a state in which the seal tank lid 60 is closed, a lower end portion of the partition 72 (the tip in the extending direction) is in contact with or immersed in the sealing liquid 58. With the above, the upper portion space 50U of the seal tank 50 is partitioned into a first space 50U1 and a second space 50U2 with the partition 72 of the partition member 70.

The first space 50U1 is formed on the refrigerant tank 20 side with respect to the partition 72. The first space 50U1 is connected to or in communication with the upper portion space 20U of the refrigerant tank 20 through the connection port 24. Furthermore, in a state in which the refrigerant tank lid 26 and the seal tank lid 60 are closed, the upper portion space 20U of the refrigerant tank 20 and the first space 50U1 of the seal tank 50 are closed spaces (airtight spaces). Note that a lower side of the first space 50U1 is closed by a liquid surface 58F of the sealing liquid 58.

The second space 50U2 is formed on the side opposite the refrigerant tank 20 with respect to the partition 72. The second space 50U2 is connected to or communicated with the outside of the seal tank 50 through the cable outlet 56.

The pushing portion 76 is provided in the lower end portion of the partition 72. A lateral cross-sectional shape of the pushing portion 76 is semicircular. The pushing portion 76 immersed in the sealing liquid 58 is spaced away from a bottom 50L of the seal tank 50. With the above, in a state in which the seal tank lid 60 is closed, a wiring space 78 of the cables 34 is formed between the pushing portion 76 and the bottom 50L of the seal tank 50. In other words, the partition member 70 partitions the upper portion space 50U of the seal tank 50 while leaving the wiring space 78 of the cables 34 between the partition member 70 and the bottom 50L of the seal tank 50. The wiring space 78 is formed across the entire length of the partition member 70 in the width direction as illustrated with an arrow W direction in FIG. 2.

Furthermore, the underside 76L of the pushing portion 76 is a curved surface forming a downwards convexity. The underside 76L submerges the cables 34 in the sealing liquid 58. With the above, portions 34X of the cables 34 are immersed in the sealing liquid 58 while in a curved state. Note that the pushing portion 76 is an example of a lower end portion of the partition member 70.

Note that when a curvature of the portions (the curved portions) 34X of the curved cables 34 becomes equivalent to or larger than a predetermined value, the portions 34X may become damaged. As a measure taken for the above, in the present exemplary embodiment, the curvature of the underside 76L of the pushing portion 76 is under the predetermined curvature in which the cables 34 become damaged. With the above, in a case in which the portions 34X of the cables 34 are curved along the underside 76L of the pushing portion 76, damage to the portions 34X may be suppressed.

A method of storing the electronic devices 32 in the immersion cooling device 12 and a method of arranging the cables 34 in the immersion cooling device 12 will be described next.

As illustrated in FIG. 4A, first, an operator opens the refrigerant tank lid 26 of the refrigerant tank 20 and the seal tank lid 60 of the seal tank 50. With the above, the storage opening 30 of the refrigerant tank body 22 becomes open and the seal tank opening 54 of the seal tank body 52 becomes open. Note that a predetermined amount of refrigerant liquid 14 is accommodated in the refrigerant tank body 22 of the refrigerant tank 20 in advance. Similarly, a predetermined amount of sealing liquid 58 is accommodated in the seal tank body 52 of the seal tank in advance.

Subsequently, the operator accommodates the electronic devices 32 in the refrigerant tank body 22 through the storage opening 30, and immerses the lower portions of the electronic devices 32 in the refrigerant liquid 14. In so doing, the electronic devices 32 are accommodated inside the refrigerant tank body 22 along guide rails (not shown) provided on the inner wall surface of the refrigerant tank body 22.

Subsequently, the operator passes the cables 34 through the cable outlet 56 of the seal tank 50 and the connection port 24 of the refrigerant tank 20. With the above, the cables 34 are arranged along the upper portion space 20U of the refrigerant tank 20 and the upper portion space 50U of the seal tank 50.

Subsequently, the operator electrically connects connectors (not shown) provided at end portions of the cables 34 and connectors (not shown) provided at upper portions of the electronic devices 32 to each other. In so doing, the operator connects the connectors of the cables 34 to the connectors of the electronic devices 32 before immersing the connector of the electronic devices 32 in the refrigerant liquid 14. Subsequently, the operator further submerges the electronic devices 32 in the refrigerant liquid 14 such that the electronic devices 32 are entirely immersed in the refrigerant liquid 14.

Subsequently, the operator closes the refrigerant tank lid 26 of the refrigerant tank 20 and the seal tank lid 60 of the seal tank 50. With the above, the storage opening 30 of the refrigerant tank body 22 is closed (sealed) and the seal tank opening 54 of the seal tank body 52 is closed (sealed).

Note that as illustrated in FIGS. 5A and 5B, when the seal tank lid 60 is closed, the partition member 70 provided on the underside of the seal tank lid 60 is inserted into the seal tank body 52. With the above, the portions 34X of the cables 34 disposed in the upper portion space 50U of the seal tank 50 are submerged into the sealing liquid 58 with the underside 76L of the pushing portion 76 of the partition member 70. As a result, the portions 34X of the cables 34 are immersed in the sealing liquid 58 while being curved along the underside 76L of the pushing portion 76.

Furthermore, as illustrated in FIG. 6, in a state in which the seal tank lid 60 is closed, the sealing materials 74 provided at the end portions 72E on both sides of the partition 72 in the width direction are urged and are in contact with the inner wall surfaces 52SA of the side walls 52S of the seal tank body 52. With the above, as illustrated in FIG. 5B, in a state in which the seal tank lid 60 is closed, the upper portion space 50U of the seal tank 50 is partitioned into the first space 50U1 and the second space 50U2 with the partition 72.

Furthermore, in a state in which the seal tank lid 60 is closed, the wiring space 78 of the cables 34 is formed in the sealing liquid 58. Specifically, the wiring space 78 is formed between the underside 76L of the pushing portion 76 of the partition member 70 and bottom 50L of the seal tank 50. The portions 34X of the cables 34 submerged in the sealing liquid 58 with the pushing portion 76 are disposed in the wiring space 78. Moreover, the cables 34 are arranged across the first space 50U1 and the second space 50U2 through the wiring space 78. Moreover, in a state in which the refrigerant tank lid 26 and the seal tank lid 60 are closed, the upper portion space 20U of the refrigerant tank 20 and the first space 50U1 of the seal tank 50 become closed spaces.

Note that when the refrigerant liquid 14 of the refrigerant tank 20 vaporizes, the vaporized refrigerant in a gaseous state (hereinafter, referred to as "vaporized refrigerant 14V") flows into the first space 50U1 of the seal tank 50 through the upper portion space 20U of the refrigerant tank 20 and the connection port 24. Meanwhile, the first space 50U1 is a closed space as described above. With the above, the vaporized refrigerant 14V is suppressed from leaking to the outside of the seal tank 50 from the cable outlet 56 through the wiring space 78.

Note that while there is a possibility of the vaporized refrigerant 14V dissolving into the sealing liquid 58, the sealing liquid 58 of the present exemplary embodiment is a liquid into which the vaporized refrigerant 14V does not easily dissolve. With the above, the vaporized refrigerant 14V is suppressed from dissolving into the sealing liquid 58. Accordingly, a decrease in the refrigerant liquid 14 is suppressed.

An example of a maintenance method of the electronic device 32 will be described next.

The following is performed when the operator, for example, replaces the electronic component mounted on the electronic device 32. In other words, the operator opens the refrigerant tank lid 26 of the refrigerant tank 20 and the seal tank lid 60 of the seal tank 50. With the above, the storage opening 30 of the refrigerant tank 20 becomes open and the seal tank opening 54 of the seal tank 50 becomes open.

Subsequently, the operator draws out the electronic device 32 from the storage opening 30 of the refrigerant tank 20 and replaces the electronic component mounted on the electronic device 32. In so doing, the operator appropriately detaches and attaches the cable 34 from the electronic device 32.

Subsequently, the operator accommodates the electronic device 32 in the refrigerant tank body 22 and immerses the entire electronic device 32 in the refrigerant liquid 14. Subsequently, the operator closes the refrigerant tank lid 26 of the refrigerant tank 20 and the seal tank lid 60 of the seal tank 50. With the above, the portion 34X of the cable 34 arranged in the upper portion space 50U of the seal tank 50 is submerged into the sealing liquid 58 with the partition member 70.

Furthermore, when the operator closes the seal tank lid 60, the upper portion space 50U of the seal tank 50 is partitioned into the first space 50U1 and the second space 50U2 with the partition member 70. With the above, the upper portion space 20U of the refrigerant tank 20 and the first space 50U1 of the seal tank 50 become closed spaces. As a result, the vaporized refrigerant 14V that has flowed into the first space 50U1 of the seal tank 50 from the upper portion space 20U of the refrigerant tank 20 is suppressed from leaking to the outside of the seal tank 50 from the cable outlet 56 through the wiring space 78.

Effects of the first exemplary embodiment will be described next.

In the present exemplary embodiment, in a state in which the seal tank lid 60 is closed, the portions 34X of the cables 34 disposed in the upper portion space 50U of the seal tank 50 is submerged into the sealing liquid 58 with the pushing portion 76 of the partition member 70. The portions 34X of the cables 34 are disposed in the wiring space 78 formed between the underside 76L of the pushing portion 76 of the partition member 70 and the bottom 50L of the seal tank 50.

Furthermore, in a state in which the seal tank lid 60 is closed, the upper portion space 50U of the seal tank 50 is partitioned into the first space 50U1 and the second space 50U2 with the partition 72 of the partition member 70. While the first space 50U1 is in communication with the upper portion space 20U of the refrigerant tank 20 though the connection port 24 through which the cables 34 pass, the first space 50U1 and the upper portion space 20U of the refrigerant tank 20 are closed spaces (airtight spaces).

With the above, the vaporized refrigerant 14V that has flowed into the first space 50U1 from the upper portion space 20U of the refrigerant tank 20 through the connection port 24 may be suppressed from leaking to the outside of the seal tank 50 from the cable outlet 56 through the wiring space 78. Accordingly, a decrease in the refrigerant liquid 14 is suppressed.

Meanwhile, the cables 34 that have been arranged in the first space 50U1 of the seal tank 50 from the refrigerant tank 20 and through the connection port 24 are arranged in the second space 50U2 through the wiring space 78 formed in the sealing liquid 58 and are drawn out to the outside of the seal tank 50 through the cable outlet 56.

As described above, in the present exemplary embodiment, leaking of the vaporized refrigerant 14V from the seal tank 50 may be suppressed while the cables 34 are drawn out from the cable outlet 56 of the seal tank 50.

Furthermore, a sealing material into which the vaporized refrigerant 14V does not easily dissolve is used as the sealing liquid 58. With the above, since the amount of vaporized refrigerant 14V in the first space 50U1 dissolving into the sealing liquid 58 decreases, a decrease in the refrigerant liquid 14 is suppressed.

Moreover, in the present exemplary embodiment, the wiring space 78 of the cables 34 is formed in the sealing liquid 58. With the above, for example, compared with a case in which a sealing material is filled inside the hole through which the cable is arranged, in the case of the present exemplary embodiment, the wiring space 78 may be easily sealed (enclosed).

Furthermore, even when a plurality of cables 34 are arranged in the wiring space 78, gaps between the neighboring cables 34 are filled with the sealing liquid 58. Accordingly, even when a plurality of cables 34 are arranged in the wiring space 78, the wiring space 78 may be sealed in a more reliable manner.

Furthermore, the wiring space 78 is formed across the entire length of the partition member 70 in the width direction. With the above, a number of cables 34 may be arranged in the wiring space 78 easily.

Moreover, the sealing liquid 58 is liquid. Accordingly, by submerging the cables 34 in the sealing liquid 58 with the pushing portion 76 of the partition member 70, the operator may wire the cables 34 in the wiring space 78. On the other hand, when taking out the cables 34 from the wiring space 78, the operator opens the seal tank lid 60 and draws out the partition member 70 from the seal tank body 52 so that the cables 34 may be drawn out from the sealing liquid 58. Accordingly, maintenance and the like of the electronic device 32 is facilitated.

Second Exemplary Embodiment

A description of a second exemplary embodiment will be given next. Note that members and the like that have the same configuration as those of the first embodiment are denoted with the same reference numerals and detailed descriptions thereof are appropriately omitted.

Figure 7:
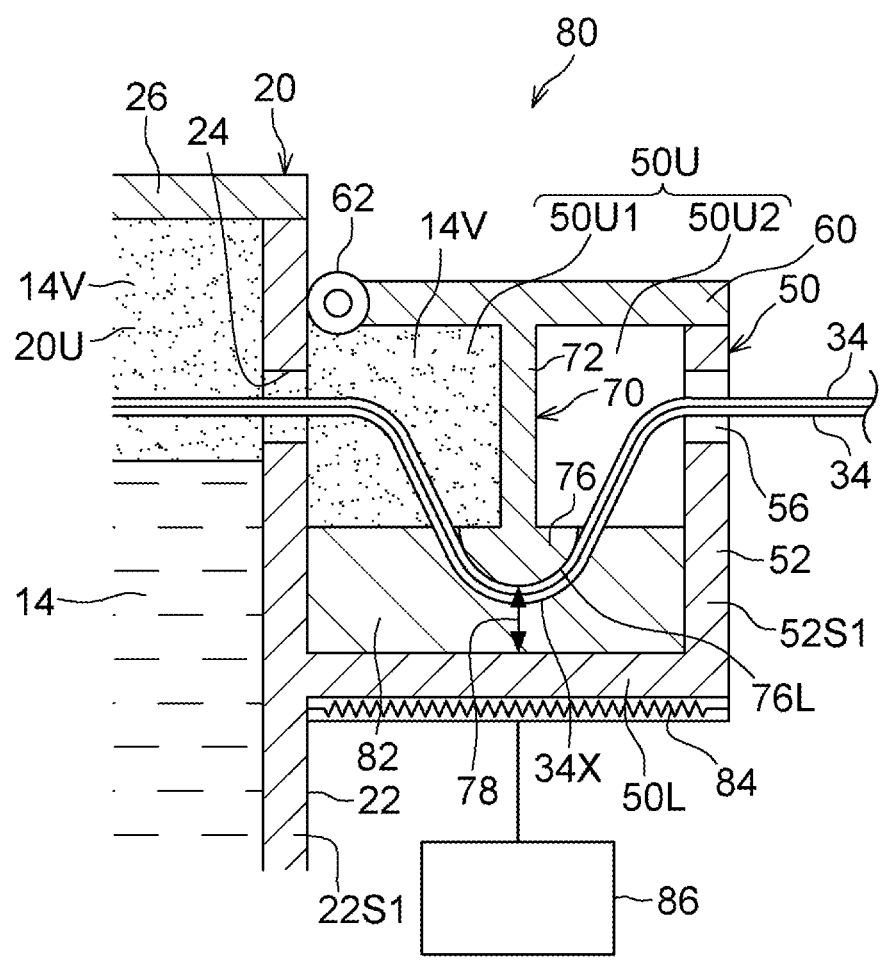
FIG. 7 is a longitudinal section of a seal tank according to a second exemplary embodiment and corresponds to FIG. 5B.

As illustrated in FIG. 7, in an immersion cooling device 80 according to the second exemplary embodiment, a brazing filler metal is used as a sealing material 82 accommodated in the seal tank 50. The brazing filler material is in a solid state (a solid) at room temperature; however, when heated, the brazing filler material melts (liquefies) and changes into a liquid state (a liquid). Furthermore, when the brazing filler metal in the liquid state is cooled, the brazing filter metal changes into a solid state.

The immersion cooling device 80 includes a sealing material heater 84 that heats the sealing material 82. The sealing material heater 84 includes, for example, an electric heater, and generates heat by being supplied with electricity from a power source 86. The sealing material heater 84 may be disposed below the seal tank 50 and is capable of heating, through the bottom 50L of the seal tank 50, the sealing material 82 accommodated in the seal tank 50.

A method of arranging the cables 34 to the seal tank 50 will be described next.

FIG. 7 illustrates a state in which the seal tank lid 60 is closed and the heating by the sealing material heater 84 is stopped. In such a state, the sealing material 82 is in a solid state while the pushing portion 76 of the partition member 70 is immersed in the sealing material 82 and while the cables 34 are arranged in the wiring space 78 inside the sealing material 82.

In the above state, when the cables 34 are taken out from the seal tank 50 upon maintenance and the like of the electronic devices 32 (see FIG. 3), the operator first actuates the sealing material heater 84. With the above, the sealing material 82 is heated with the sealing material heater 84. Moreover, when the temperature of the sealing material 82 reaches a predetermined value or higher, the sealing material 82 melts and changes into a liquid state. As a result, the pushing portion 76 of the partition member 70 may be drawn out from the sealing material 82.

Subsequently, the operator opens the refrigerant tank lid 26 of the refrigerant tank 20 and the seal tank lid 60 of the seal tank 50. With the above, the storage opening 30 of the seal tank 50 and the seal tank opening 54 become open. Furthermore, when the operator opens the seal tank lid 60, the partition member 70 provided in the seal tank lid 60 is drawn out from the seal tank body 52.

Subsequently, the operator drawing out the cables 34 from the sealing material 82 in the seal tank 50 draws out the electronic devices 32 from the refrigerant liquid 14 of the refrigerant tank 20. In the above state, the operator performs maintenance on the electronic devices 32.

Subsequently, the operator submerges the electronic devices 32 in the refrigerant liquid 14 of the refrigerant tank 20 such that the electronic devices 32 are entirely immersed in the refrigerant liquid 14. Subsequently, the operator closes the refrigerant tank lid 26 of the refrigerant tank 20 and the seal tank lid 60 of the seal tank 50. With the above, the storage opening 30 of the refrigerant tank 20 is closed and the seal tank opening 54 of the seal tank 50 is closed.

Furthermore, when the operator closes the seal tank lid 60, the partition member 70 provided in the seal tank lid 60 is accommodated inside the seal tank body 52. Moreover, the portions 34X of the cables 34 arranged in the upper portion space 50U is submerged into the sealing material 82 in a liquid state with the pushing portion 76 of the partition member 70, and is disposed in the wiring space 78 formed inside the sealing material 82. Furthermore, the upper portion space 50U of the seal tank 50 is partitioned into the first space 50U1 and the second space 50U2 with the partition 72 of the partition member 70.

Subsequently, the operator stops the operation of the sealing material heater 84. With the above, the temperature of the sealing material 82 gradually decreases and the sealing material 82 changes into a solid state.

Note that when the sealing material 82 changes into a solid state, the vaporized refrigerant 14V of the first space 50U1 is suppressed from dissolving into the sealing material 82. Accordingly, a decrease in the refrigerant liquid 14 is reduced.

Furthermore, when the sealing material 82 changes into a solid state, the pushing portion 76 of the partition member 70 is fixed to the sealing material 82. With the above, while in a closed state, the seal tank lid 60 is locked. Accordingly, the seal tank lid 60 may be kept away from opening against the intent of the operator.

Third Exemplary Embodiment

A description of a third exemplary embodiment will be given next. Note that members and the like that have the same configuration as those of the first embodiment are denoted with the same reference numerals and detailed descriptions thereof are appropriately omitted.

Figure 8:
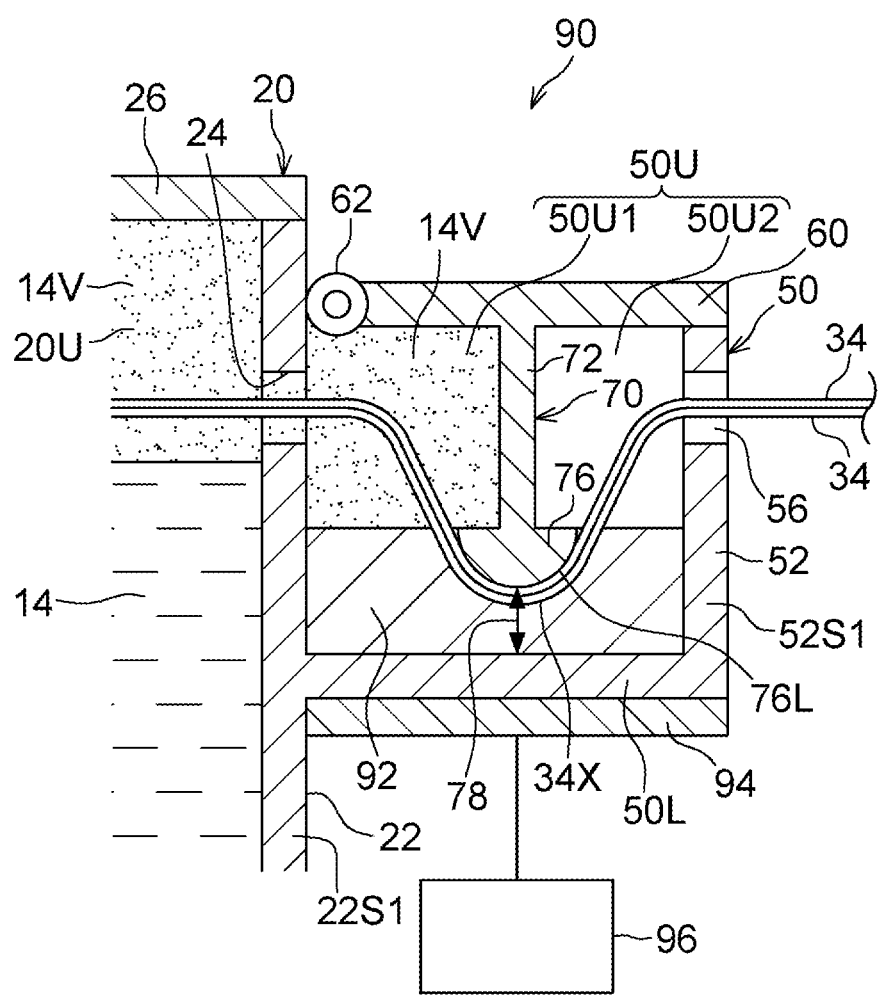
FIG. 8 is a longitudinal section of a seal tank according to a third exemplary embodiment and corresponds to FIG. 5B.

As illustrated in FIG. 8, in an immersion cooling device 90 according to the third exemplary embodiment, a liquid, such as water, is used as a sealing material 92 accommodated in the seal tank 50.

Furthermore, the immersion cooling device 90 includes a sealing material cooler 94 that cools the sealing material 92. The sealing material cooler 94 includes, for example, a Peltier element (a thermoelectric element) and performs a cooling action by being supplied with electricity from a power source 96. The sealing material cooler 94 is disposed below the seal tank 50 and is capable of cooling, through the bottom 50L of the seal tank 50, the sealing material 92 accommodated in the seal tank 50.

A method of arranging the cables 34 to the seal tank 50 will be described next.

FIG. 8 illustrates a state in which the seal tank lid 60 is closed and the sealing material cooler 94 is in operation. In such a state, the sealing material 92 is cooled by the sealing material cooler 94. With the above, the sealing material 92 changes into a frozen state (a solid state) while the pushing portion 76 of the partition member 70 is immersed in the sealing material 92 and while the portions 34X of the cables 34 are arranged in the wiring space 78 inside the sealing material 92.

In the above state, when the cables 34 are taken out from the seal tank 50 upon maintenance and the like of the electronic devices 32 (see FIG. 3), the operator first stops the operation of the sealing material cooler 94. With the above, cooling of the sealing material 92 with the sealing material cooler 94 is stopped. Moreover, when the temperature of the sealing material 92 reaches a predetermined value or higher, the sealing material 92 melts and changes into a liquid state. As a result, the pushing portion 76 of the partition member 70 may be drawn out from the sealing material 92.

Subsequently, the operator opens the refrigerant tank lid 26 of the refrigerant tank 20 and the seal tank lid 60 of the seal tank 50. With the above, the storage opening 30 of the refrigerant tank 20 becomes open and the seal tank opening 54 of the seal tank 50 becomes open. Furthermore, when the operator opens the seal tank lid 60, the partition member 70 provided in the seal tank lid 60 is drawn out from the seal tank body 52.

Subsequently, the operator drawing out the cables 34 from the sealing material 92 in the seal tank 50 draws out the electronic devices 32 from the refrigerant liquid 14 of the refrigerant tank 20. In the above state, the operator performs maintenance on the electronic devices 32.

Subsequently, the operator submerges the electronic devices 32 in the refrigerant liquid 14 of the refrigerant tank 20 such that the electronic devices 32 are entirely immersed in the refrigerant liquid 14. Subsequently, the operator closes the refrigerant tank lid 26 of the refrigerant tank 20 and the seal tank lid 60 of the seal tank 50. With the above, the storage opening 30 of the refrigerant tank 20 is closed and the seal tank opening 54 of the seal tank 50 is closed.

Furthermore, when the operator closes the seal tank lid 60, the partition member 70 provided in the seal tank lid 60 is accommodated inside the seal tank body 52. Moreover, the portions 34X of the cables 34 arranged in the upper portion space 50U is submerged into the sealing material 92 in a liquid state with the pushing portion 76 of the partition member 70, and is disposed in the wiring space 78 formed inside the sealing material 92. Furthermore, the upper portion space 50U of the seal tank 50 is partitioned into the first space 50U1 and the second space 50U2 with the partition 72 of the partition member 70.

Subsequently, the operator actuates the sealing material cooler 94 such that the sealing material cooler 94 cools the sealing material 92. With the above, the temperature of the sealing material 92 gradually decreases and the sealing material 92 changes into a frozen state (a solid state).

Note that when the sealing material 92 changes into a frozen state, the vaporized refrigerant 14V of the first space 50U1 is suppressed from dissolving into the sealing material 92. Accordingly, a decrease in the refrigerant liquid 14 is reduced.

Furthermore, when the sealing material 92 changes into a frozen state, the pushing portion 76 of the partition member 70 is fixed to the sealing material 92. With the above, while in a closed state, the seal tank lid 60 is locked. Accordingly, the seal tank lid 60 may be kept away from opening against the intent of the operator.

[Modification]

Modifications of the first to third exemplary embodiments described above will be described next. Note that in the following description, various modifications will be exemplarily described based upon the first exemplary embodiment; however, the modification may be appropriately applied to the second and third exemplary embodiments as well.

Figure 9:
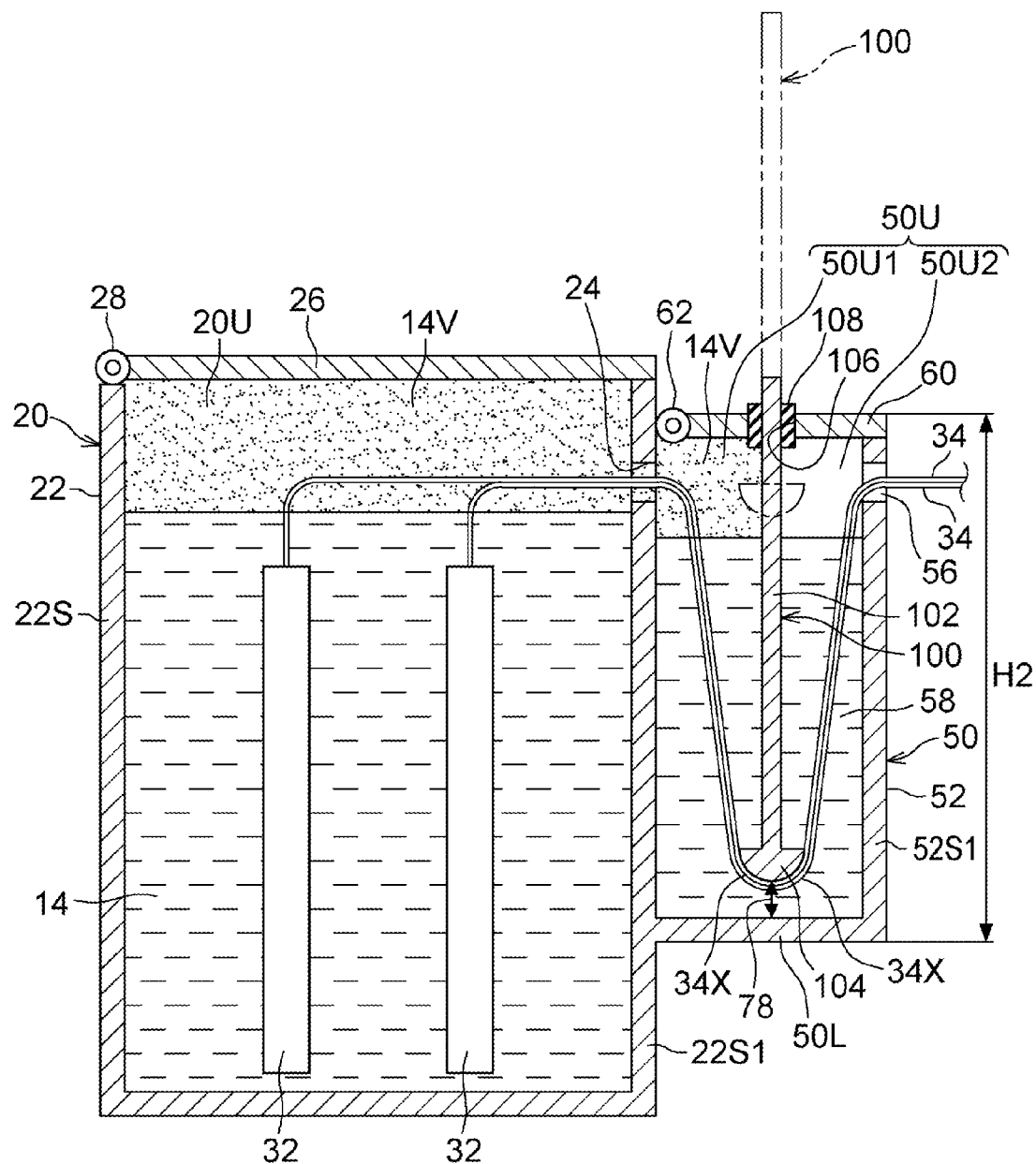
FIG. 9 is a longitudinal section of a modification of the seal tank according to the first exemplary embodiment and corresponds to FIG. 3.

First, in the modification illustrated in FIG. 9, the size of the seal tank 50 with respect to the refrigerant tank 20 is large compared with that of the first exemplary embodiment. Specifically, a height H2 of the seal tank 50 is set larger than a height H1 (see FIG. 5A) of the seal tank 50 of the first exemplary embodiment.

Note that while the sealing liquid 58 does not easily vaporize at room temperature, a slight amount thereof vaporizes. Moreover, the vaporized sealing liquid 58 flows to the outside of the seal tank 50 through the cable outlet 56. Accordingly, the sealing liquid 58 in the seal tank 50 gradually decreases with time. Accordingly, the sealing liquid 58 is replenished to the seal tank 50 on a regular basis.

Conversely, the modification illustrated in FIG. 9 may accommodate (retain) a larger amount of sealing liquid 58 in the seal tank 50 compared with that of the first exemplary embodiment. Accordingly, the intervals in which the sealing liquid 58 is replenished into the seal tank 50 are longer. Accordingly, maintenance of the seal tank 50 is facilitated.

Furthermore, in the modification illustrated in FIG. 9, the partition member 100 is elongated according to the height H2 of the seal tank 50. The partition member 100 includes a partition 102 and a pushing portion 104. Note that the pushing portion 104 is an example of a lower end portion of the partition member 100.

Meanwhile, an insertion hole 106 that penetrates through the seal tank lid 60 in a thickness direction (an up-down direction) is formed in the middle portion of the seal tank lid 60. The partition 102 of the partition member 100 is inserted in the insertion hole 106 in a slidable manner. Note that the gap between the partition 102 and the insertion hole 106 is sealed with a sealing material 108, such as rubber.

Note that the partition member 100 is slidable with respect to the seal tank lid 60 in the thickness direction of the seal tank lid 60. With the above, in a state in which the seal tank lid 60 is closed, the partition member 100 may partition the upper portion space 50U of the seal tank 50 into the first space 50U1 and the second space 50U2, and the portions 34X of the cables 34 arranged in the upper portion space 50U may be submerged in the sealing liquid 58.

Furthermore, by increasing or decreasing the amount in which the partition member 100 is slid with respect to the seal tank lid 60, the operator may adjust the size of the wiring space 78 between the pushing portion 104 and the bottom 50L of the seal tank 50 according to the number of cables 34 that is arranged in the seal tank 50. Accordingly, the versatility of the seal tank 50 is increased.

Figure 10A:
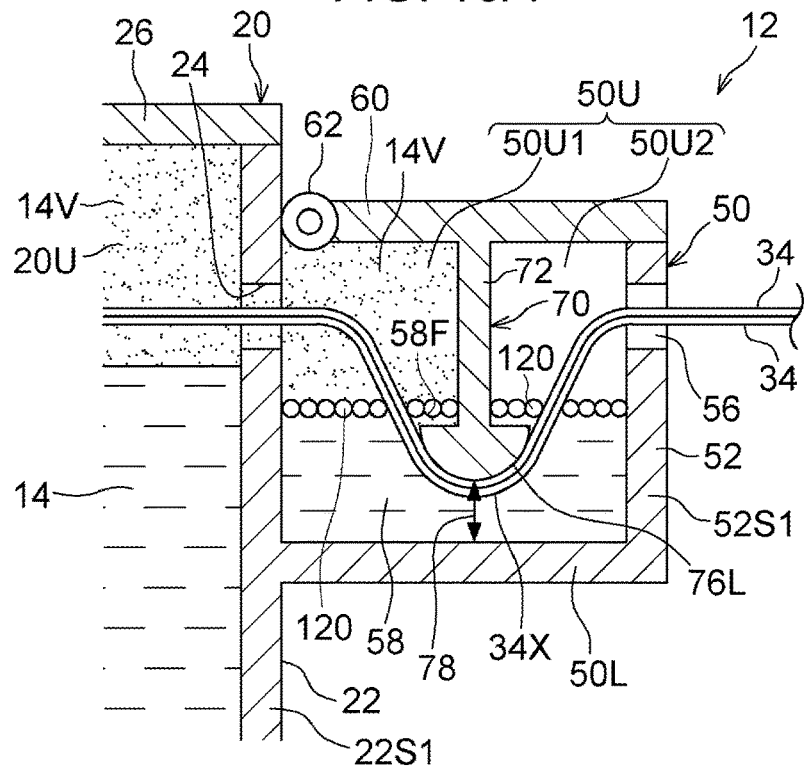
FIG. 10A is a longitudinal section illustrating an evaporation suppression material and corresponds to FIG. 3.

Subsequently, in the modification illustrated in FIG. 10A, a plurality of evaporation suppression materials 120 are accommodated in the seal tank 50. The plurality of evaporation suppression materials 120 are formed in a spherical shape. Furthermore, the evaporation suppression materials 120 are formed with a material, such as a sponge or a foamed material, that has a specific gravity that is less than that of the sealing liquid 58. With the above, the evaporation suppression materials 120 are accommodated in the seal tank 50 while floating on the liquid surface 58F of the sealing liquid 58.

Note that as described above, the plurality of evaporation suppression materials 120 float on the liquid surface 58F of the sealing liquid 58. Accordingly, the area of contact between the liquid surface 58F of the sealing liquid 58 and the gas inside the upper portion space 50U of the seal tank 50 is decreased. As a result, the sealing liquid 58 does not easily vaporize. Accordingly, a decrease in the sealing liquid 58 is reduced.

Figure 10B:
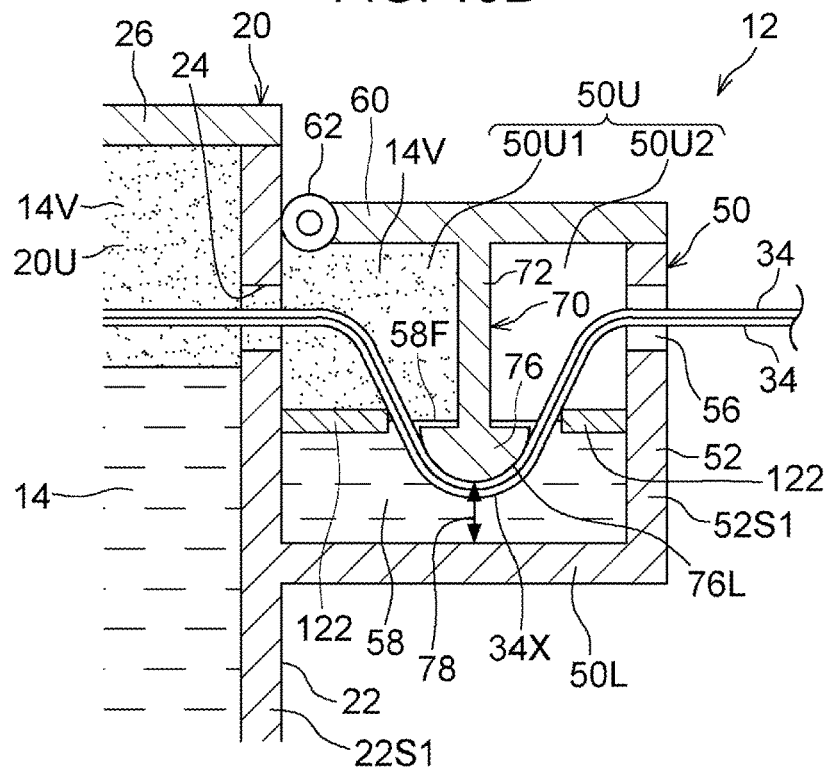
FIG. 10B is a longitudinal section illustrating an evaporation suppression material and corresponds to FIG. 3.

Note that as illustrated in FIG. 10B, evaporation suppression materials 122 may be tabular or sheet-shaped, or may be any other shape.

Figure 11:
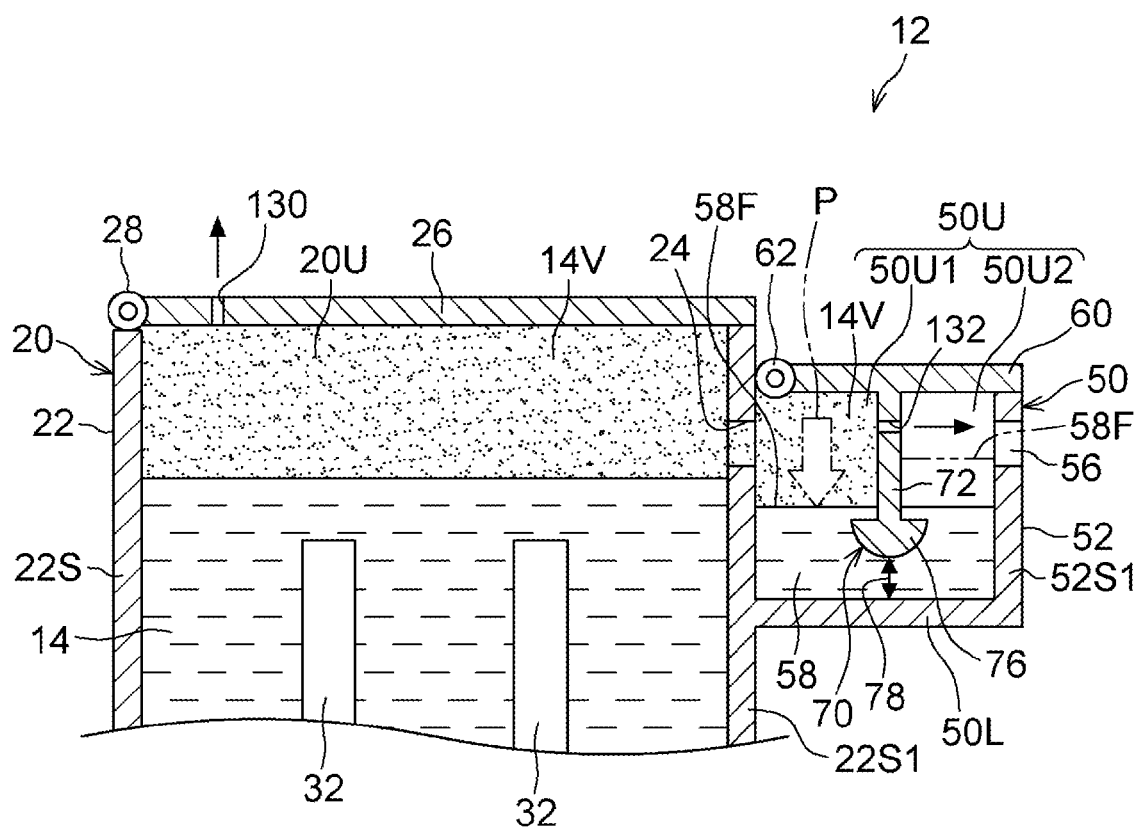
FIG. 11 is a longitudinal section of a modification of the seal tank according to the first exemplary embodiment and corresponds to a partially enlarged view of FIG. 3.

Incidentally, as illustrated in FIG. 11, when the refrigerant liquid 14 of the refrigerant tank 20 vaporizes, an inner pressure of the upper portion space 20U of the refrigerant tank 20 increases, and an inner pressure P of the first space 50U1 of the seal tank 50 increases. As a result, as illustrated by a two-dot chain line, the liquid surface 58F of the sealing liquid 58 in the seal tank 50 on the second space 50U2 side may increase and the sealing liquid 58 may leak out of the seal tank 50 from the cable outlet 56.

As a measure taken for the above, in the modification illustrated in FIG. 11, the refrigerant tank 20 includes an inner pressure adjustment hole 130 that adjusts the inner pressure of the upper portion space 20U. The inner pressure adjustment hole 130 is a through hole that penetrates the refrigerant tank lid 26 in the thickness direction. The upper portion space 20U of the refrigerant tank 20 is open to the atmosphere with the inner pressure adjustment hole 130. As a result, an increase in the inner pressure of the upper portion space 20U of the refrigerant tank 20 is suppressed, and an increase in the inner pressure P of the first space 50U1 of the seal tank 50 is suppressed. As a result, the liquid surface 58F of the sealing liquid 58 in the seal tank 50 on the second space 50U2 side is suppressed from rising up. Accordingly, the sealing liquid 58 inside the seal tank 50 is suppressed from leaking to the outside of the seal tank 50 through the cable outlet 56.

Furthermore, the partition member 70 includes an inner pressure adjustment hole 132 that adjusts the inner pressure of the first space 50U1. The inner pressure adjustment hole 132 is a through hole that penetrates the partition 72 of the partition member 70 in the thickness direction. The first space 50U1 and the second space 50U2 are connected to (in communication with) each other with the inner pressure adjustment hole 132. With the inner pressure adjustment hole 132, through the second space 50U2 and the cable outlet 56, the first space 50U1 is open to the atmosphere. With the above, an increase in the inner pressure of the first space 50U1 of the seal tank 50 is suppressed. Accordingly, the sealing liquid 58 is further suppressed from leaking to the outside of the seal tank 50 through the cable outlet 56.

Note that the number and arrangement of the inner pressure adjustment holes 130 and 132 may be appropriately changed. For example, the inner pressure adjustment hole may be formed in the side walls 22S of the refrigerant tank body 22. Furthermore, for example, the inner pressure adjustment hole may be formed in the seal tank lid 60 of the seal tank 50.

Subsequently, in the modification illustrated in FIG. 12, a cable holder 140 are provided in the seal tank 50. The cable holder 140 extends upwards from the bottom 50L of the seal tank 50. A hook 140L bent in a hook shape is provided in an upper end portion of the cable holder 140. The cables 34 are hooked to the hook 140L. With the above, the cables 34 are held in the sealing liquid 58. Accordingly, in the modification illustrated in FIG. 12, the pushing portion 76 of the partition member 70 (see FIG. 5B) may be omitted. Accordingly, the structure of the partition member 70 is simplified.

Figure 12:
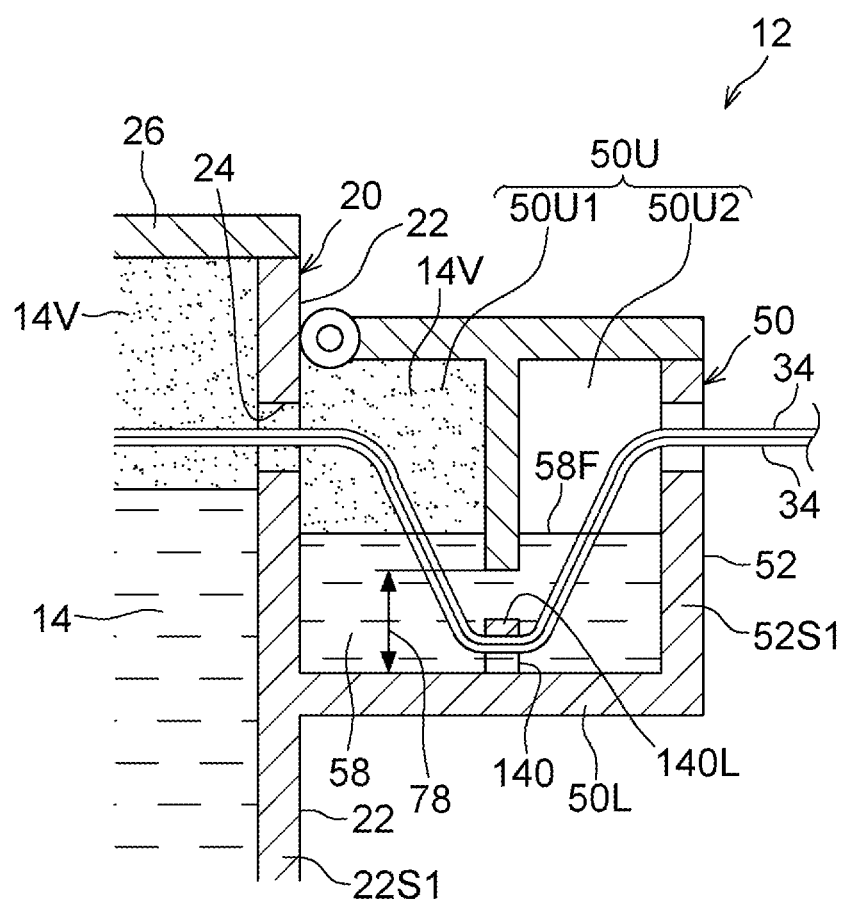
FIG. 12 is a longitudinal section of a modification of the seal tank according to the first exemplary embodiment and corresponds to FIG. 5B.

Furthermore, in the modification illustrated in FIG. 12, the cables 34 may be suppressed from jutting out from the seal tank opening 54 of the seal tank 50 when the operator opens the seal tank lid 60.

Figure 13:
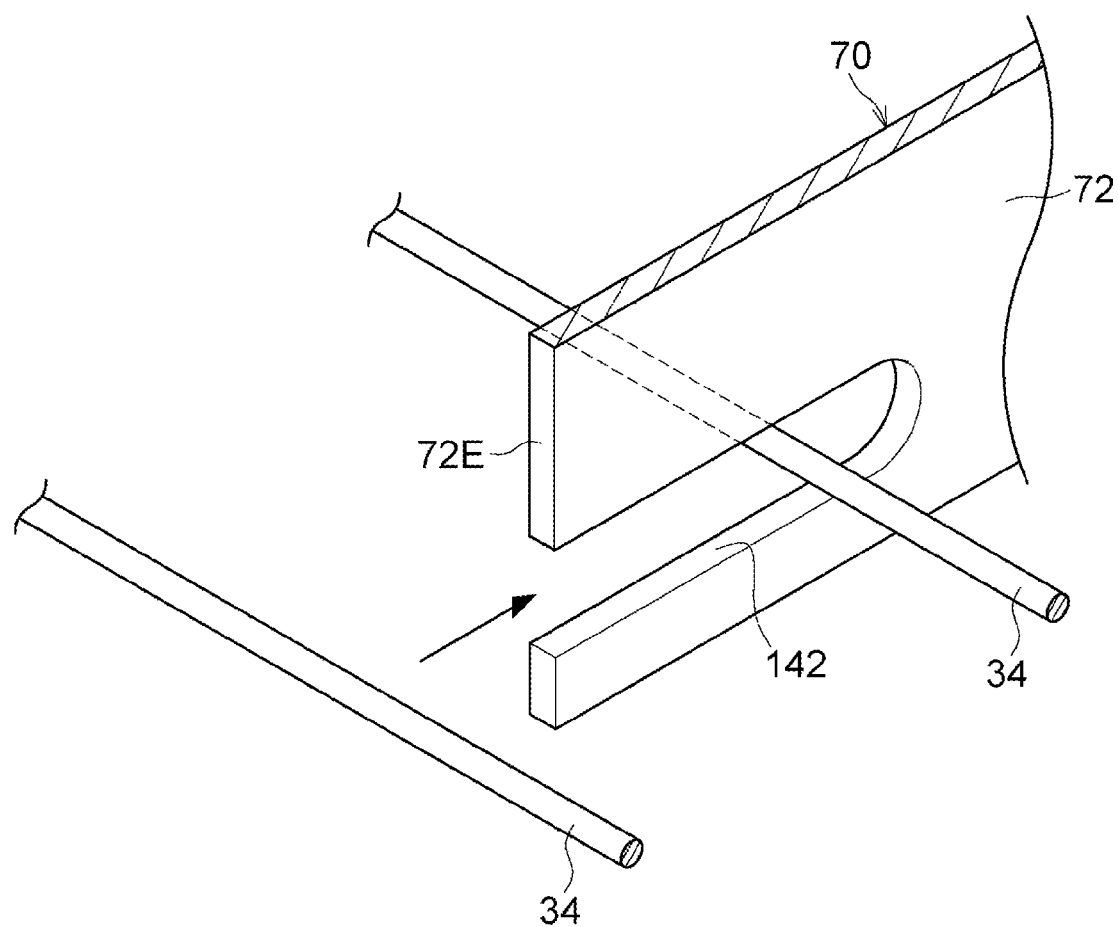
FIG. 13 is a perspective view illustrating a modification of a partition member according to the first exemplary embodiment.

Subsequently, in the modification illustrated in FIG. 13, a cable holder 142 is provided in the partition 72 of the partition member 70. The cable holder 142 is a U-shaped groove formed at the end portion 72E of the partition 72. When the cables 34 are inserted in the cable holder 142, the cables 34 are held by the partition member 70.

With the above, the cables 34 may be suppressed from jutting out from the seal tank opening 54 of the seal tank 50 when the seal tank lid 60 is opened. Note that in the partition member 70 illustrated in FIG. 13, the pushing portion 76 is not provided. Furthermore, in the modification illustrated in FIG. 13, the lower end portion of the partition member 70 may be made to come in contact with the bottom 50L of the seal tank 50.

Subsequently, in the modification illustrated in FIGS. 14A and 14B, the refrigerant tank lid 26 and the seal tank lid 60 are integrated as one. Specifically, the refrigerant tank 20 and the seal tank 50 include a lid 150 that extends across the refrigerant tank body 22 and the seal tank body 52. The lid 150 is attached to an upper end portion of the refrigerant tank body 22 through a hinge 152.

Figure 14A:
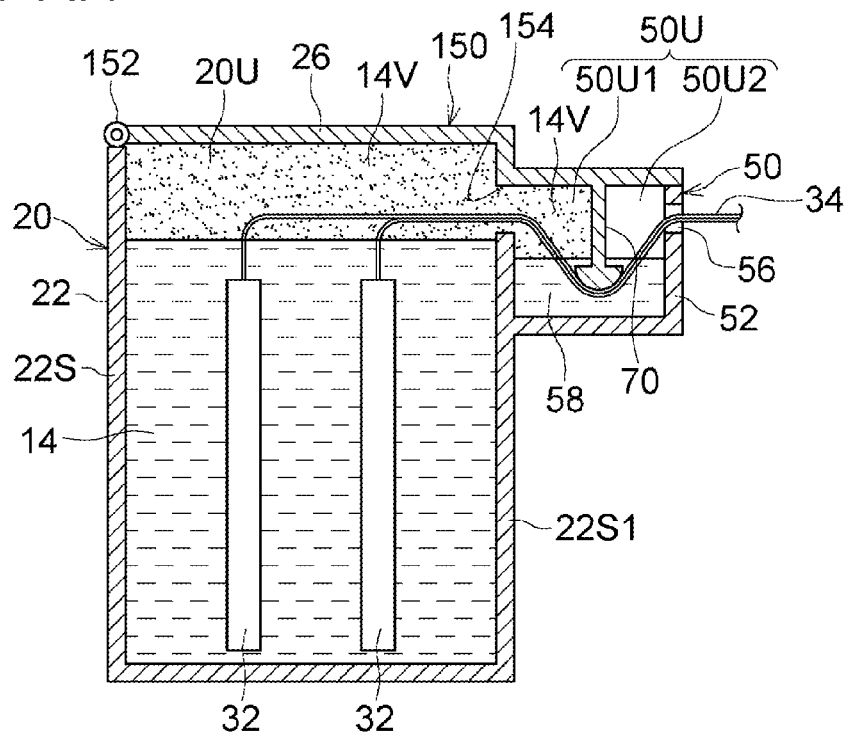
FIG. 14A is a longitudinal section illustrating a lid hinge of the refrigerant tank and the seal tank according to a modification the first exemplary embodiment in a closed state and corresponds to FIG. 3.
Figure 14B:
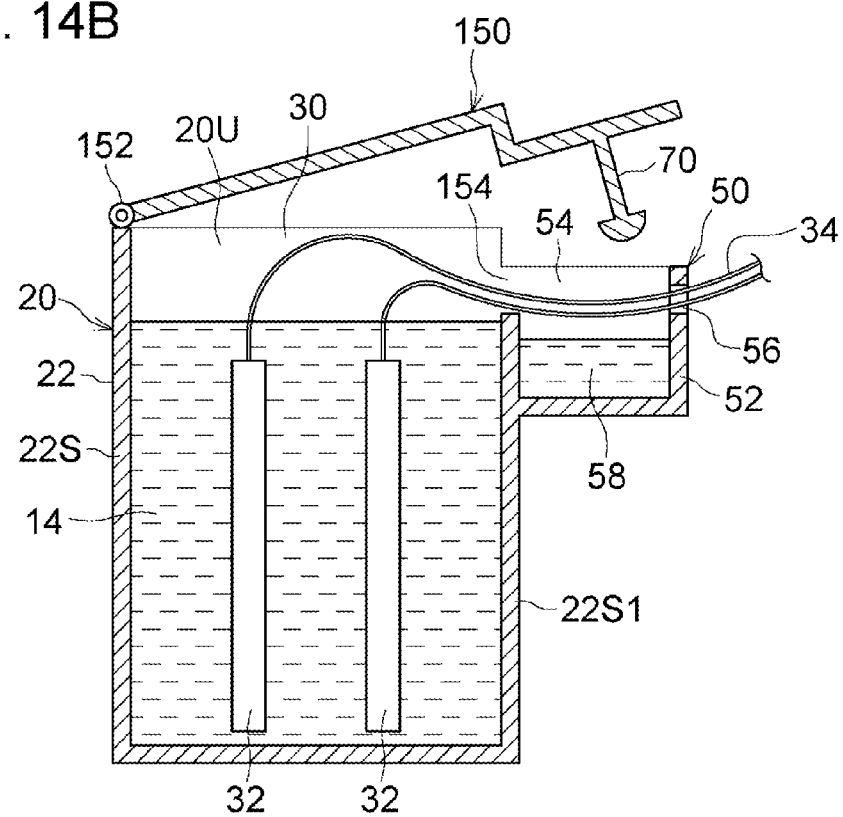
FIG. 14B is a longitudinal section illustrating the lid hinge of the refrigerant tank and the seal tank according to the modification the first exemplary embodiment in an open state and corresponds to FIG. 3.

In the modification illustrated in FIGS. 14A and 14B, since a single lid 150 is opened and closed, the work of opening and closing the lid 150 is smaller compared to opening each of the refrigerant tank lid 26 and the seal tank lid 60 separately.

Furthermore, in the modification illustrated in FIGS. 14A and 14B, a groove-shaped connection port 154 open upwards is formed at the side wall 22S1 (a bounding wall) shared by the refrigerant tank 20 and the seal tank 50. With the above, arranging of the cables 34 in the connection port 154 is facilitated. Accordingly, maintenance and the like of the electronic devices 32 (see FIG. 3) is facilitated.

Furthermore, in the first exemplary embodiment described above, the refrigerant tank lid 26 is attached to the refrigerant tank body 22 with the hinge 28. However, the refrigerant tank lid 26 may be detachably attached to the refrigerant tank body 22 without the hinge 28. In a similar manner, the seal tank lid 60 may be detachably attached to the seal tank lid 60 without the hinge 62.

Furthermore, in the first exemplary embodiment, the underside 76L of the pushing portion 76 of the partition member 70 has a curved surface. However, the shape of the underside 76L of the pushing portion 76 may be appropriately modified and, for example, may be a planar surface. Furthermore, the pushing portion 76 may be omitted from the partition member 70.

Furthermore, in the first exemplary embodiment described above, the refrigerant tank 20 and the seal tank 50 share the side wall 22S1. However, the refrigerant tank 20 and the seal tank 50 may each be provided with a separate side wall. In such a case, refrigerant tank 20 and the upper portion space 50U of the seal tank 50 are connected to each other through a connection passage, for example. Furthermore, the position and the shape of the cable outlet 56 may be appropriately changed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An immersion cooling device, comprising:
   a refrigerant tank configured to accommodate a refrigerant liquid and a first upper space;
   a seal tank configured to accommodate a sealing material and communicate with the first upper space of the refrigerant tank through an upper space of the seal tank; and
   a partition member configured to separate the upper space of the seal tank with the sealing material into a second upper space which communicates with the first upper space of the refrigerant tank and a third upper space which communicates with the outside of the seal tank, wherein
   the first upper space of the refrigerant tank and the second upper space of the seal tank are sealed by the refrigerant tank, the refrigerant liquid, the seal tank, the sealing material, and the partition member.

2. The immersion cooling device according to claim 1, wherein
   when an electronic device including a cable is immersed in the refrigerant tank, the cable is arranged from the refrigerant tank to the outside through the second upper space, the sealing material, and the third upper space.

3. An immersion cooling device, comprising:
   a refrigerant tank configured to accommodate a refrigerant liquid in which an electronic device is immersed;
   a seal tank configured to accommodate a sealing material and communicate with the refrigerant tank through an upper space of the seal tank, a cable connected to the electronic device being disposed in the upper portion space; and
   a partition member that, in a state in which a portion of the cable disposed in the upper portion space is immersed in the sealing material in a liquid state, partitions the upper portion space into a first space that is in communication with the refrigerant tank, and a second space that is in communication with an outside of the seal tank.

4. The immersion cooling device according to claim 3, wherein the seal tank includes
   a seal tank body configured to include a seal tank opening at an upper portion thereof, the seal tank body accommodating the sealing material, and
   a seal tank lid configured to open and close the seal tank opening, and wherein, in a state in which the seal tank lid is provided and in which the seal tank lid closes the seal tank opening, the partition member partitions the upper space.

5. The immersion cooling device according to claim 4, wherein the seal tank lid is connected to the seal tank body with a hinge, and the seal tank opening is opened and closed upon pivoting of the seal tank lid about the hinge.

6. The immersion cooling device according to claim 4, wherein the partition member slides with respect to the seal tank lid in a thickness direction of the seal tank lid.

7. The immersion cooling device according to claim 3, wherein, in a state in which the partition member partitions the upper space, a lower end portion of the partition member is in contact with the sealing material.

8. The immersion cooling device according to claim 7, wherein the partition member partitions the upper space while a wiring space of the cable is formed between the lower end portion of the partition member and a bottom of the seal tank.

9. The immersion cooling device according to claim 7, wherein an underside of the lower end portion of the partition member is a curved surface forming a downwards convexity.

10. The immersion cooling device according to claim 3, wherein, in a state in which the partition member partitions the upper space, a lower end portion of the partition member is immersed in the sealing material in a liquid state.

11. The immersion cooling device according to claim 3, further comprising
    an evaporation suppression material that floats on a liquid surface of the sealing material in a liquid state.

12. The immersion cooling device according to claim 3, wherein the seal tank includes an inner pressure adjustment hole that opens the first space to the atmosphere.

13. The immersion cooling device according to claim 3, wherein the partition member includes an inner pressure adjustment hole that connects the first space and the second space to each other.

14. The immersion cooling device according to claim 3, wherein the refrigerant tank includes an inner pressure adjustment hole that opens an upper space of the refrigerant tank to the atmosphere.

15. The immersion cooling device according to claim 3, wherein the seal tank includes a connection port that connects the first space and the refrigerant tank to each other and through which the cable passes.

16. The immersion cooling device according to claim 3, wherein the seal tank includes a cable outlet through which the cable is drawn out from the second space to an outside of the refrigerant tank.

17. The immersion cooling device according to claim 3, the partition member includes a cable holder that, while holding the cable, immerses the cable in the sealing material in a liquid state.

18. The immersion cooling device according to claim 3, wherein the sealing material is a liquid, and
wherein the immersion cooling device further includes a sealing material cooler that cools the sealing material and that changes the sealing material into a solid state.

19. The immersion cooling device according to claim 3, wherein the sealing material is a solid, and
wherein the immersion cooling device further includes a sealing material heater that heats the sealing material and that changes the sealing material into a liquid state.

20. The immersion cooling device according to claim 3, wherein the refrigerant tank includes
a refrigerant tank body including a storage opening at an upper portion thereof through which the electronic device is accommodated, the refrigerant tank body accommodating the electronic device and the refrigerant liquid, and
a refrigerant tank lid that opens and closes the storage opening.

\* \* \* \* \*